United States Patent [19]

Kaplan

[11] Patent Number: 5,308,991

[45] Date of Patent: May 3, 1994

[54] METHOD AND APPARATUS FOR MAKING A PREDISTORTED RETICLE TO COMPENSATE FOR LENS DISTORTIONS

[75] Inventor: Shay Kaplan, Sunnyvale, Calif.

[73] Assignee: National Semiconductor Corporation, Santa Clara, Calif.

[21] Appl. No.: 892,277

[22] Filed: Jun. 2, 1992

[51] Int. Cl.$^5$ .............................................. H01J 37/30
[52] U.S. Cl. .................................. 250/492.22; 430/5; 355/52; 378/35
[58] Field of Search ............ 250/492.22, 492.2, 492.1, 250/492.3; 430/5; 355/52, 53; 378/34, 35

[56] References Cited

U.S. PATENT DOCUMENTS

| | | | |
|---|---|---|---|
| 4,433,384 | 2/1984 | Berrian et al. | 250/492.2 |
| 4,592,081 | 5/1986 | Eaton et al. | 378/34 |
| 4,621,371 | 11/1986 | Gotou et al. | 378/34 |
| 5,117,255 | 5/1992 | Shiraishi et al. | 355/53 |
| 5,208,124 | 5/1993 | Sporon et al. | 430/5 |

Primary Examiner—Jack I. Berman
Assistant Examiner—James Beyer
Attorney, Agent, or Firm—Limbach & Limbach

[57] ABSTRACT

A method and apparatus for making predistorted masks or reticles which compensate for lens field errors for use in the fabrication of integrated circuit devices. The lens error is first expressed as distortion data. The data is used to produce correction terms which are applied to an interferometrically controlled stage which positions the mask or reticle beneath a writing tool. When the predistorted mask or reticle is used in conjunction with the lens for which the distortion data was obtained, an integrated circuit device is produced which does not incorporate the lens field errors.

17 Claims, 4 Drawing Sheets

METHOD AND APPARATUS FOR MAKING A PREDISTORTED RETICLE TO COMPENSATE FOR LENS DISTORTIONS

TECHNICAL FIELD

The present invention is generally directed to reticles utilized in fabricating integrated circuits, and more specifically, to a method and apparatus for making predistorted reticles which compensate for lens field errors when used in photolithographic processes.

BACKGROUND OF THE INVENTION

In the production of integrated circuits, a mask or reticle is used in conjunction with a radiation source and lens system to define the desired pattern of circuit features and interconnections on a wafer or substrate of semiconductor material. A mask is used to transfer a pattern onto an entire wafer in a single exposure step, while a reticle is used to transfer multiple exposures of the same pattern onto a wafer in "step-and-repeat" fashion.

A reticle is composed of a transparent substrate on which is deposited a thin layer of material that serves as the template for the pattern which will be transferred to the wafer surface. The substrate material is typically soda-lime glass, borosilicate glass, or quartz. The material with which the glass is coated is typically emulsion, chrome, or iron oxide and is deposited on the glass by means of sputtering or evaporation techniques.

The material deposited on the glass serves as the pattern template and is etched to contain a multitude of apertures which, by their shapes, sizes, and locations, define the structure of the device which is to be fabricated. The template features are then defined on a photoresist coated wafer of semiconductor material by means of known photolithographic processes.

The first step in the reticle making process is to "write" the pattern of features onto the chrome layer (or other pattern material) of the reticle. This defines those regions of the material which will be removed to form the pattern template. The reticle is coated with a thin layer of photoresist, or if an E-beam (electron beam) is used to write the patterns, a suitable E-beam resist. The reticle is then exposed by an optical or E-beam system. The exposure defines the desired patterns on the resist layer. Two types of scanning tools are presently used to write the device patterns. They are termed "raster" scanners (which scan the beam in the y-direction while the reticle is moved in the x-direction), and "vector" scanners (which scan the beam in both the x and y directions over the reticle).

The patterns defined on the resist layer are generated in the form of rectangles. Each rectangle is defined by a height (H), width (W), x and y position coordinates, and an angle ($\theta$) representing the orientation of the rectangle relative to the coordinate axes. The writing tool exposes the resist covered pattern material while it is moved under the tool by a stage whose position is controlled by a laser interferometer. After the writing step is completed, the resist is developed and then baked prior to the etching step. The etching step removes portions of the chrome or other pattern material, resulting in the finished pattern template.

After the reticle is fabricated, it is used in conjunction with a projection system to define the device features on a resist coated wafer of semiconductor material. In defining the device features on the wafer, a lens is used to project an image of the reticle onto the wafer. A lens may also be used to reduce the mask image at the wafer surface so that multiple mask images can be defined on the resist layer.

Another method of defining device features on a wafer is to write the device features directly onto the wafer without the use of a mask or reticle. This method uses an electron beam or optical source which is transmitted through a projection system and which directly exposes the resist coated wafer. A direct writing tool also uses a controlled stage to position the wafer beneath the tool.

A problem that can arise when using either of these techniques is that a lens may have inherent errors which distort light passing through it. Standard types of lens field errors are trapezoid errors, anamorphisms, and linear or non-linear reduction errors. A common type of error is that which arises when the magnification of the lens varies with the radial distance from the lens center. This makes the magnification power of the lens a function of the region on the lens surface through which the source radiation passes. This type of lens field error leads to the "pincushion" or "barrel" effect found in some images.

Lens field errors introduce manufacturing flaws into the integrated circuit fabrication process because the exposed regions of the resist layer do not represent an exact image of the template. When mixing different types of exposure tools in a manufacturing process, errors can occur because each tool, or set of tools, has its own distortion pattern. This means that some layer geometries that are patterned by one type of tool, may be displaced relative to previous layer(s) that were patterned by a different tool. In the case of a direct writing method, patterns written by these tools will not perfectly overlay previous layers patterned by optical tools using lenses with inherent distortions. Lens errors can lead to the incorrect placement of features relative to each other, and to a reduced yield of correctly operating devices.

A method of compensating for lens distortions when using a vector scanner as a direct writing tool has been developed by IBM (International Business Machines), and is described in P. Coane, et al., "Electron Beam-/Optical Mixed Lithography at Half-Micron Ground Rules", in Microelectronic Engineering 5 (1986), pp. 133-140, published by Elsevier Science Publishers B.V. A similar approach is described in T. Newman, et al., "High Resolution Shaped Electron Beam Lithography", in Microlithography World, March/April 1992, p.16.

The method discussed in these references is based on dividing the field of the lens into sub-fields and then calculating the distortion correction for the center point of each sub-field. The correction for the center points is then applied to all points in the sub-field by means of registration marks placed on the periphery of the exposure field. The marks serve as alignment guides for the tool when it exposes the resist coated wafer during the fabrication of the device. The placement of the marks is a function of the lens distortion data, and results in a uniform shift in the location of the features. This method compensates for the lens errors by altering the placement of the device features on the wafer as the resist layer on the wafer is exposed.

The above method is limited to fabrication processes which use direct writing tools, and its effectiveness is limited by the need for alignment structures on the periphery of each field and the amount of data storage available. This is because, in order to compensate for higher order distortion terms, the scale on which the corrections are applied must be smaller. Thus, the lens field must be divided into a greater number of sub-fields so that the correction applied to each center point is sufficient to compensate for the distortion. This requires that there be enough storage capacity to store the distortion data for the lens, and the corresponding correction terms used to remove the distortion.

Another method of correcting for lens distortions when using vector E-beam writing tools is based on the proximity correction software which is part of such tools. E-beam vector scanners utilize the software to correct for the effects of scattering of the electron beam in the resist material by adjusting the exposure times of adjacent features. This compensates for the exposure of a feature adjacent to the one being written due to the scattering of electrons out of the main beam. The proximity correction software can be used to compensate for lens distortions by scanning the device feature after it has been exposed using the stepper lens, and using the results as the basis for corrections which are fedback into the writing tool as though they were proximity errors, for use when the same feature is subsequently written. This correction scheme is limited to use with vector scanners because it relies on the writing tool having access to the coordinates of each point so that the corrections can be applied to each point as it is written.

What is desired is a means of compensating for lens field errors when using a raster or vector scanner to fabricate a mask or reticle, where the means does not require a large amount of data storage memory, and where the means is capable of correcting for the field errors independently of the grid size of the mask making or device fabrication tool.

SUMMARY OF THE INVENTION

The present invention is directed to a method of compensating for lens field errors in the photolithographic processes used in integrated circuit fabrication. The invention provides a method and apparatus for making predistorted reticles which incorporate compensating corrections for known lens distortions. The distortion data for a lens is used to calculate x and y dimension correction terms, expressed as ($\delta x, \delta y$). The correction terms are a function of the location (in x and the features which are defined on a mask or reticle by a writing tool. The correction terms are utilized during the mask writing process to alter the movement of the stage on which the mask or reticle moves under the writing tool.

The stage uses a laser interferometer to position the mask or reticle under the writing tool. The stage movement required to write a device feature depends on the location address of the feature. The stage controller determines if the movement required to position the mask has occurred based on the number of interference fringes detected and the wavelength of laser light used in the interferometer.

The stage used to position the mask or reticle beneath the writing tool is typically equipped with a port for input of wavelength correction data. Often this data port is a weather port which accepts data on the surrounding environment (temperature, humidity, air pressure).

The environmental or other wavelength correction data is used by the stage controller to calculate the index of refraction for the propagation medium of the laser. The index of refraction is then used to calculate an effective wavelength for the laser based on the propagation velocity in the environment. In this way, the stage controller alters the wavelength used in the calculations which position the stage. The wavelength adjustment is implemented by means of the stage controller's compensation value (which incorporates the wavelength correction data). The compensation value is multiplied by the wavelength of the laser light in vacuum to obtain the effective wavelength of the laser in the actual propagation environment.

The concept behind the present invention is to alter the stage controller's compensation value so that it incorporates correction terms which are derived from the lens distortion data. Since the coordinates of the stage position correspond to the location where the feature is written onto the mask or reticle, if they are altered by applying the adjusted compensation value, the feature will be displaced on the reticle. In this way a predistorted reticle is created. When this reticle is used in conjunction with the lens system, the lens errors are compensated for and a properly functioning device is produced.

The method and apparatus of the present invention takes the lens distortion data (which represents the feature displacement on the wafer as a function of the field position of the lens) and uses it to calculate x and y dimension correction terms. The correction terms are then inverted to obtain the factors used to adjust the positioning of the stage. The inverted correction terms are multiplied by the stage controller's compensation value, altering the stage control wavelength used in the calculations which position the stage.

The result is an adjusted compensation value which correctly positions the stage under the writing tool. The reticle which is produced incorporates the correction terms, and this predistorted reticle serves as the basis for fabricating correctly function devices when used in conjunction with the lens for which the distortion data was obtained.

The present invention is therefore not dependent upon the grid size with which the mask or reticle writing (or wafer fabrication) tool operates and does not slow down the wafer fabrication process. The present invention can be used with either vector or raster scanning tools. Instead of altering the writing of device features on the wafer, the process of making the mask is changed by affecting the movement of the stage carrying the mask material. The mask or reticle can then be used to fabricate multiple devices with no further loss of time.

Further objects and advantages of the present invention will become apparent from the following detailed description and accompanying drawings.

DETAILED DESCRIPTION OF THE PREFERRED EMBODIMENT

Figure 1A:
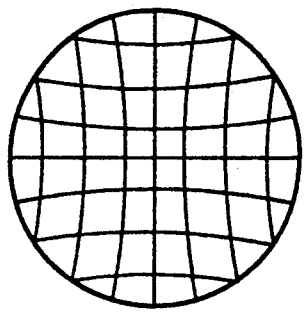
FIG. 1A shows a typical "pincushion" magnification distortion produced by a lens.
Figure 1A:
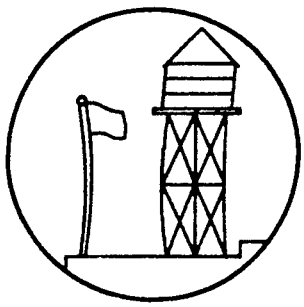
Figure 1B:
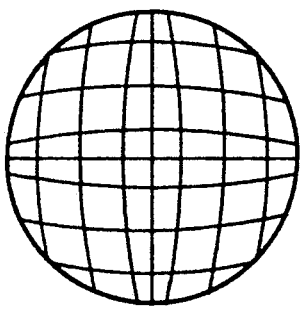
FIG. 1B shows a typical "barrel" magnification distortion produced by a lens.
Figure 1B:
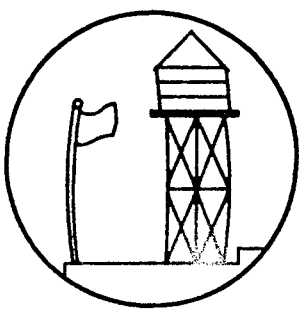

FIGS. 1A and 1B show two typical types of lens field errors that can occur. FIG. 1A shows a "pincushion" type of magnification distortion, while FIG. 1B shows what is termed a "barrel" distortion. Both of these distortions cause a displacement of portions of the image produced by the lens from the positions they would occupy in the absence of such a distortion.

Figure 2:
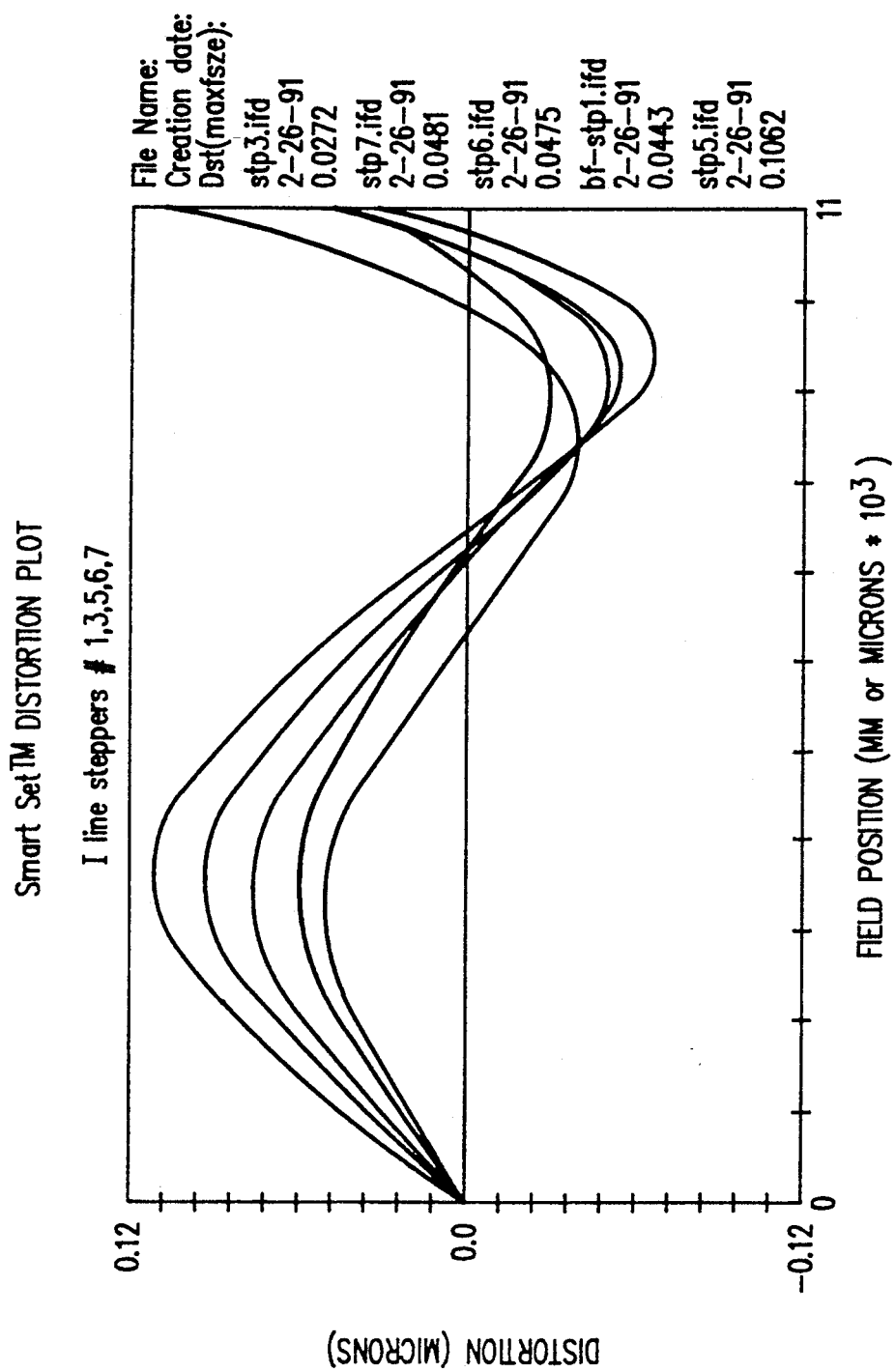
FIG. 2 is a graph showing the 3rd and 5th order distortion (feature displacement) of a lens as a function of the radial distance on the lens surface.

FIG. 2 is a graph on which is plotted the 3rd and 5th order lens magnification distortion data for a specific lens or lens family. The graph shows a plot of the lens distortion as a function of the field position of the lens, where the field position is expressed as the radial position on the lens surface. The lens distortion is the amount of displacement of an image which occurs when a reticle feature is illuminated and its image projected by the lens onto another surface.

Figure 3:
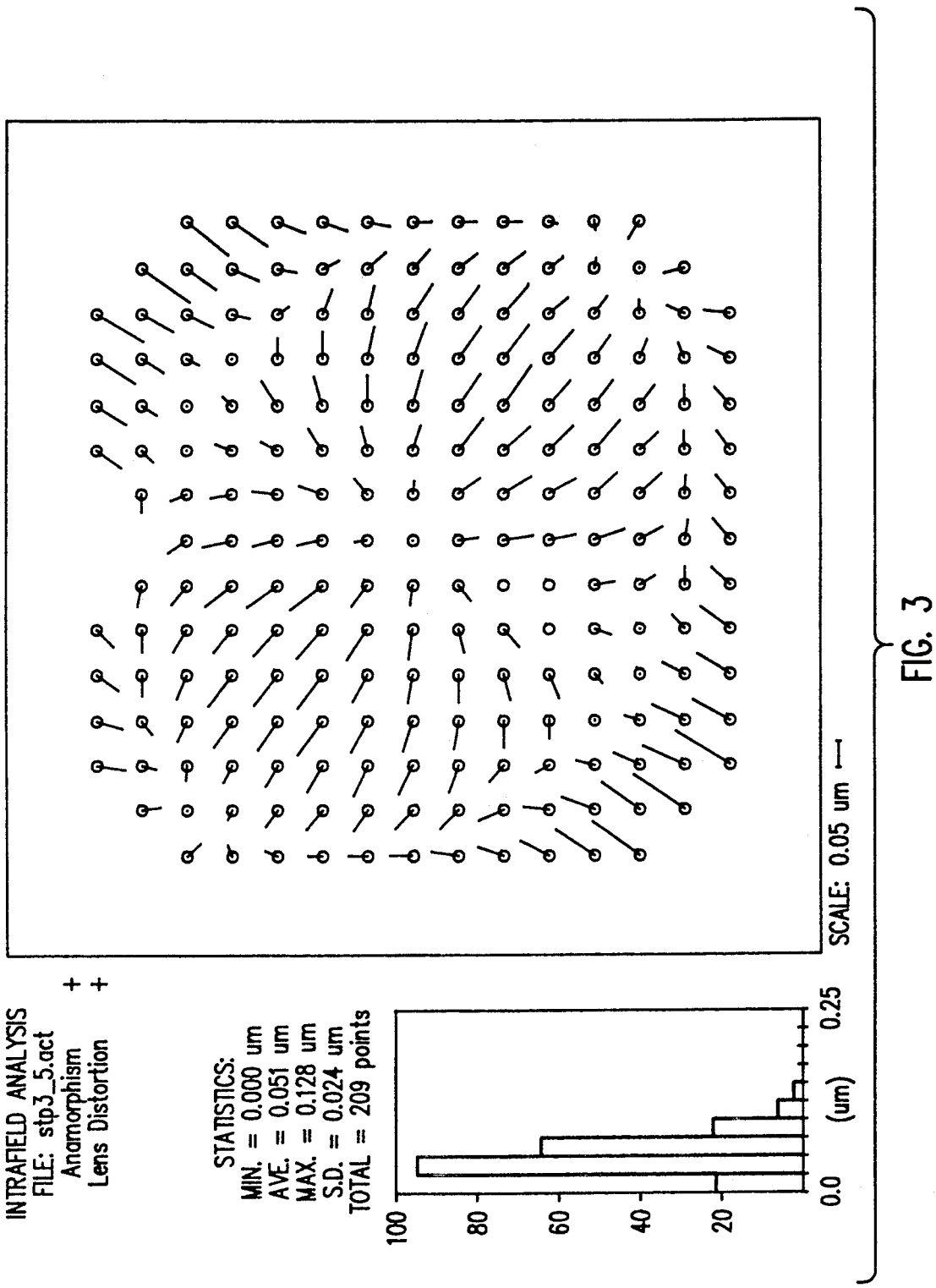
FIG. 3 is a pictorial representation of an anamorphic lens error combined with the lens distortion data of FIG. 2.

FIG. 3 shows a pictorial representation of an anamorphic lens error combined with the lens distortion data of FIG. 2. The small circles represent points on the lens surface (defined by x and y coordinates). The lines associated with the circles represent the lens distortion at that point on the lens surface. The length of the line corresponds to the magnitude of the distortion, while the direction corresponds to the direction in which the image is displaced due to the distortion. The data contained in FIGS. 2 and 3 can be used to calculate the displacement error ($\delta x, \delta y$) caused by the lens when light passes through a point (x,y) on the lens surface.

Figure 4:
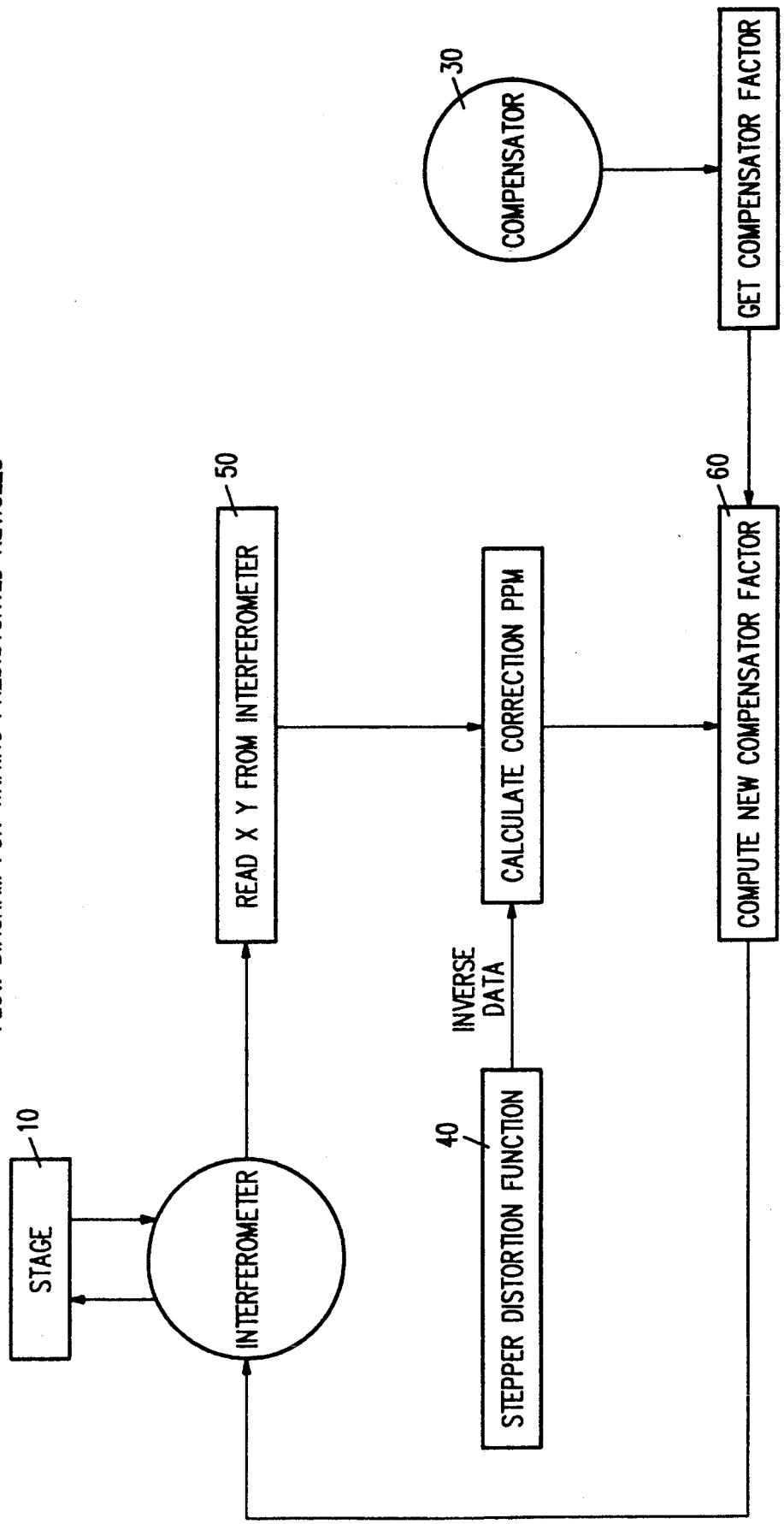
FIG. 4 is a block diagram showing the functional components of an interferometrically controlled stage which incorporates the present invention.

FIG. 4 is a block diagram illustrating the components of an interferometrically controlled stage which incorporates the present invention. The stage 10 on which the mask or reticle material sits is connected to an interferometer 20 which controls the stage position. The interferometer has associated with it a compensator 30 which provides the compensation factor used to adjust the wavelength which is used to position the stage, and hence the location of features which are written on the mask.

In accordance with the present invention, the compensation factor is adjusted so that it depends upon the correction terms based on the lens distortion data. The compensation factor is then multiplied by the laser wavelength in vacuum to obtain the effective wavelength used to position the stage.

The distortion data for the lens or lens family used in the projection system is available from a storage means 40. The lens distortion data is usually expressed in terms of a lens distortion function which provides the distortion or offset of a feature as a function of the field position of the lens. The field position can be defined either in terms of the radial distance (R) from the lens center, or in terms of the (x,y) coordinates of a point on the lens surface. The offset is expressed as an error ($\delta r$) in the radial direction, where $\delta r$ can be positive or negative, or as an error in the (x,y) coordinates ($\delta x, \delta y$).

The present invention can be used to correct for any type of lens field error. To make the invention clearer, the method of correcting for a lens magnification distortion will be presented as an example. In accordance with the present invention, the lens error is modeled as a radial error function. This represents the distortion produced by the lens as a function of the radial distance R, and is represented by a polynomial in odd powers of R.

The coefficients for the polynomial terms are obtained in a known manner from metrology packages which accompany the lens systems. The metrology packages are capable of analyzing the lens distortions and providing data (often in the form of a modeling function and the required coefficients) representing the magnitude of the distortion. A typical metrology package is the "MONO-LITH® Registration Analysis Package", produced by Shipley, Co. Inc.

A typical error function for a magnification distortion might be expressed as:

$$\text{Error} = C_1 R^3 r + C_2 R^5 r + C_3 R^7 r + \ldots,$$

where $C_1$, $C_2$, and $C_3$ are constants, R is the radial distance measured from the lens center, and r is the unit vector in the radial direction.

If, for example, it is desired to correct for only the 3rd and 5th order errors, the error function would be expressed as:

$$\text{Error} = C_1 R^3 r + C_2 R^5 r.$$

In accordance with the present invention the error function is expressed in terms of ($\delta x, \delta y$) corrections which are a function of the (x,y) coordinates. To accomplish this, the radial unit vector r can be expressed in terms of the x and y coordinate unit vectors as:

$$r = \cos\Theta x + \sin\Theta y,$$

where $\Theta$ is the central angle in a polar coordinate system.

Substituting the expression for r into the error function, and separating the result into x and y terms, one obtains:

$$\delta x = C_1 R^3 \cos\Theta + C_2 R^5 \cos\Theta, \text{ and}$$

$$\delta y = C_1 R^3 \sin\Theta + C_2 R^5 \sin\Theta.$$

Since $x = R\cos\Theta$ and $y = R\sin\Theta$, $\delta x$ and $\delta y$ can be written as:

$$\delta x = C_1 x R^2 + C_2 x R^4, \text{ and}$$

$$\delta y = C_1 y R^2 + C_2 y R^4.$$

Finally, since $R^2 = x^2 + y^2$, $$\delta x = C_1 x^3 y^2 + C_2 x^5 y^4, \text{ and}$$

$$\delta y = C_1 y^3 x^2 + C_2 y^5 x^4.$$

The expressions for $\delta x$ and $\delta y$ now express the lens distortion error in the x and y directions in terms of the x and y coordinates of a point on the lens surface.

The $\delta x$ and $\delta y$ representations of the lens field error are used in the method and apparatus of the present invention to adjust the movement of the stage beneath the writing tool during the fabrication of the mask or reticle. The instructions which control the stage are in the form of x and y coordinate increments representing the desired stage position for the next writing step. The current location of the stage is used to determine correction factors which compensate for the lens error. The stage positioning is then altered so that the writing tool produces a reticle which compensates for the lens errors.

In accordance with the present invention, the current position of the stage beneath the writing tool expressed in x and y coordinates is obtained from the interferometer 20. The x and y coordinates correspond to a point on the lens surface through which light will pass when the reticle and lens are used to expose a wafer. This step is represented by box 50 in FIG. 4. The instructions for the writing tool are then used to determine the x and y coordinate increments for the next desired position of the stage. From the x and y coordinates of the current position, the factors $\delta x$ and $\delta y$ can be calculated based on the lens error function which is obtained form storage means 40. The calculation is performed in the manner shown above, and depends only upon the x and y values of the coordinates.

The correction terms corresponding to the address locations are found by taking the inverse of $\delta x$ and $\delta y$, i.e., $(\delta x)^{-1}$ and $(\delta y)^{-1}$. The $(\delta x)^{-1}$ and $(\delta y)^{-1}$ terms are then multiplied by the original compensation factor obtained from compensator 30. This produces the new compensator factor and is represented by box 60 in FIG. 4.

Using the $(\delta x)^{-1}$ and $(\delta y)^{-1}$ terms compensates for the lens induced errors by removing the positioning error due to the lens distortion from the coordinate increments. The new compensator factor is then multiplied by the laser wavelength in vacuum to obtain an effective wavelength which has now been adjusted for the lens errors. Using the (x,y) values for the current address in combination with those for the (x,y) coordinate increments, the stage controller moves the stage to the appropriate position for the writing tool to expose the mask or reticle.

When the stage is moved to the next writing position, determined by the stage controller counting the number of interference fringes and the laser wavelength, the effective wavelength will cause the stage to be moved to a corrected position beneath the writing tool. The mask or reticle produced will compensate for the lens errors so that when it is used in conjunction with the lens from which the distortion data was obtained, a correctly functioning device will be produced.

While the present invention has been described with reference to the specific embodiment and steps disclosed, it is understood that other, equivalent embodiments of the invention are possible, and that the practice of the invention is not intended to be limited solely to the embodiment specifically disclosed in this application.

I claim:

1. A method for producing predistorted masks or reticles which correct for lens field errors for use in the fabrication of integrated circuit devices, wherein the mask or reticle is produced by controlling the movement of a movable stage containing the mask or reticle, where the stage is disposed beneath a writing tool which writes pattern data to form the mask or reticle, the method comprising:
   expressing a lens error in terms of lens distortion data;
   converting the lens distortion data into correction terms, wherein the correction terms are a function of the location on the lens through which radiation passes; and
   using the correction terms to control the positioning of the stage, thereby causing the stage to move so that when the writing tool writes pattern data which has not been corrected for the lens error, there is produced a mask or reticle which compensates for the lens error when it is used in conjunction with the lens to fabricate a semiconductor device.

2. The method of claim 1 wherein the lens distortion data is expressed as the image displacement caused by the lens as a function of a radial coordinate on the lens surface.

3. The method of claim 1 wherein the lens distortion data is expressed as the image displacement caused by the lens as a function of x any y coordinates on the lens surface.

4. The method of claim 1 wherein the correction terms are expressed as functions of the x and y coordinates of positions on the lens surface.

5. The method of claim 1 wherein the stage positioning is controlled by a laser interferometer.

6. The method of claim 5 wherein the laser interferometer has a port for input of a wavelength correction factor, and further wherein the correction terms are input into the interferometer's wavelength correction factor port.

7. The method of claim 6 wherein the interferometer's wavelength correction factor port is a port for input of environmental data.

8. The method of claim 5 wherein the interferometrically controlled stage uses a compensation value to correct the wavelength of the laser, and further, wherein the correction terms are used to control the positioning of the stage by adjusting the compensation value.

9. A method for producing predistorted masks or reticles which correct for lens field errors for use in the fabrication of integrated circuit devices, wherein the mask or reticle is produced by controlling the movement of a movable stage containing the mask or reticle, where the stage is disposed beneath a writing tool which writes pattern data to form the mask or reticle, the method comprising:
   expressing a lens error in terms of lens distortion data;
   expressing the lens distortion data as a lens error function, wherein the lens error function is a function of either the radial or x and y coordinates on the lens surface;
   using the lens error function to generate correction terms, wherein the correction terms are a function of the location on the lens through which radiation passes; and
   using the correction terms to control the positioning of the stage, thereby causing the stage to move so that when the writing tool writes pattern data which has not been corrected for the lens error, there is produced a mask or reticle which compensates for the lens error when it is used in conjunction with the lens to fabricate a semiconductor device.

10. Apparatus for producing predistorted masks or reticles which correct for lens field errors for use in the fabrication of integrated circuit devices, wherein the apparatus includes a writing tool which writes pattern data to form the mask or reticle and a movable stage containing the mask or reticle which is disposed beneath the writing tool, the lens error being expressed in terms of lens distortion data, the apparatus comprising:
   conversion means for converting the lens distortion data into correction terms, wherein the correction terms are a function of the location on the lens through which radiation passes; and control means responsive to the correction terms for controlling the position of the stage, thereby causing the stage to move so that when the writing tool writes pattern data which has not been corrected for the lens error, there is produced a mask or reticle which compensates for the lens error when it is used in conjunction with the lens to fabricate a semiconductor device.

11. The apparatus of claim 10 wherein the lens distortion data is expressed as the image displacement caused by the lens as a function of a radial coordinate on the lens surface.

12. The apparatus of claim 10 wherein the lens distortion data is expressed as the image displacement caused by the lens as a function of x and y coordinates on the lens surface.

13. The apparatus of claim 10 wherein the correction terms are expressed as functions of the x any y coordinates of positions on the lens surface.

14. The apparatus of claim 10 wherein the stage positioning is controlled by a laser interferometer.

15. The apparatus of claim 14 wherein the laser interferometer has a port for input of a wavelength correction factor, and further wherein the correction terms are input into the interferometer's wavelength correction factor port.

16. The apparatus of claim 15 wherein the interferometer's wavelength correction factor port is a port for input of environmental data.

17. The apparatus of claim 14 wherein the interferometrically controlled stage uses a compensation value to correct the wavelength of the laser, and further, wherein the correction terms are used to control the position of the stage by adjusting the compensation value.

* * * * *